United States Patent [19]
Vaartstra et al.

[11] Patent Number: 6,133,159
[45] Date of Patent: *Oct. 17, 2000

[54] METHODS FOR PREPARING RUTHENIUM OXIDE FILMS

[75] Inventors: Brian A. Vaartstra, Nampa; Eugene P. Marsh, Boise, both of Id.

[73] Assignee: Micron Technology, Inc., Boise, Id.

[*] Notice: This patent is subject to a terminal disclaimer.

[21] Appl. No.: 09/140,932

[22] Filed: Aug. 27, 1998

[51] Int. Cl.[7] .................................................. C23L 16/40
[52] U.S. Cl. .......................... 438/758; 438/778; 438/781; 427/255.31; 427/372.2
[58] Field of Search .............................. 427/99, 576, 584, 427/585, 255.31, 372.2; 438/758, 778, 781

[56] References Cited

U.S. PATENT DOCUMENTS

| | | | |
|---|---|---|---|
| 5,130,172 | 7/1992 | Hicks et al. | |
| 5,314,727 | 5/1994 | McCormick et al. | 427/584 |
| 5,352,488 | 10/1994 | Spencer et al. | 427/250 |
| 5,372,825 | 12/1994 | McCormick et al. | 427/253 |
| 5,392,189 | 2/1995 | Fazan et al. | 361/305 |
| 5,510,651 | 4/1996 | Maniar et al. | 257/751 |
| 5,520,992 | 5/1996 | Douglas et al. | 428/209 |
| 5,555,486 | 9/1996 | Kingon et al. | 361/305 |
| 5,561,307 | 10/1996 | Mihara et al. | 257/295 |
| 5,566,045 | 10/1996 | Summerfelt et al. | 361/321.1 |
| 5,581,436 | 12/1996 | Summerfelt et al. | 361/321.1 |

OTHER PUBLICATIONS

Senzaki et al., Chemical Abstract 128:264103, Proc. Electrochem. Soc., 97–25, pp. 933–943 (no month), 1997.

Green et al., J. Electrochem. Soc., vol. 132, No. 11, pp. 2677–2685, Nov. 1985.

Cowles et al., Chemical Communications, p. 392 (no month), 1969.

Bai et al., "Low–temperature growth and orientational control in $RuO_2$ thin films by metal–organic chemical vapor deposition", *Thin Solid Films*, 310, 75–80 (1997). (no month).

Igumenov, "MO CVD of Noble Metals", *J. De Physique IV*, 5, C5–489–C5–496 (1995). (no month).

Sosinsky et al., "Hydrocarbon Complexes of Ruthenium. Part IV. Cyclic Dienyl Complexes", *J. Chem. Soc.*, 16–17, 1633–1640 (1975). (no month).

Takagi et al., "$RuO_2$ Bottom Electrodes for Ferroelectric (Pb, La)(Zr, Ti)$O_3$ Thin Fiolms by Metalorganic Chemical Vapor Deposition", *Jpn. J. Appl. Phys.*, 34, 4104–4107 (1995). (no month).

Anderson et al., "Carborane Complexes of Ruthenium: A Convenient Synthesis of $[Ru(CO)_3(\eta^5-7,8-C_2B_9H_{11})]$ and a Study of Reactions of This Complex," *Organometallics*, 14, 3516–3526 (1995). (no month).

Bennett et al., "Mono–olefin Chelate Complexes of Iron(0) an Ruthenium(0) with an Olefinic Tertiary Phosphine," *J. Chem. Soc. D.*, 7, 341–342 (1971). (no month).

Cowles et al., "Relative Reactivity of Co–ordinated Ligands inthe Dienyltricarbonyl–ruthenium Cation, [(dienyl) $Ru(CO)_3]^+$," *Chemical Commun.*, 392 (1969). (no month).

Green et al., "Chemical Vapor Deposition of Ruthenium and Ruthenium Dioxide Films," *J. Electrochem. Soc.*, 132, 2677–2685 (1985). (no month).

Johnson et al., "Chemistry," *Nature*, 901–902 (1967). (no month).

Liao et al., "Characterization of RuO2 thin films deposited on Si by metal–organic chemical vapor deposition," *Thin Solid Films*, 287, 74–79 (1996). (no month).

(List continued on next page.)

*Primary Examiner*—Timothy Meeks
*Attorney, Agent, or Firm*—Mueting, Raasch & Gebhardt, P.A.

[57] ABSTRACT

The present invention provides methods for the preparation of ruthenium oxide films from liquid ruthenium complexes of the formula $(diene)Ru(CO)_3$ wherein "diene" refers to linear, branched, or cyclic dienes, bicyclic dienes, tricyclic dienes, fluorinated derivatives thereof, combinations thereof, or derivatives thereof additionally containing heteroatoms such as halide, Si, S, Se, P, As, N, or O.

23 Claims, 1 Drawing Sheet

OTHER PUBLICATIONS

Macchioni et al., "Cationic Bis–and Tris(η2–(pyrazol–1–yl)methane) Acetyl Complexes of Iron (II) and Ruthenium (II): Synthesis, Characterization, Reactivity, and Interionic Solution Structure by NOESY NMR Spectroscopy," *Organometallics*, 16, 2139–2145 (1997). (no month).

Shin, "Characterization of $RuO_2$ Thin Films Prepared by Hot–Wall Metallorganic Chemical Vapor Deposition," *J. Electrochem. Soc.*, 144, 1055 (1997). (no month).

Versteeg et al., "Metalorganic Chemical Vapor Deposition By Pulsed Liquid Injection Using An Ultrasonic Nozzle: Titanium Dioxide on Sapphire from Titanium (IV) Isopropoxide," *Journal of the American Ceramic Society*, 78, 2763–2768 (1995). (no month).

Yuan, "Low–Temperature Chemical Vapor Deposition of Ruthenium Dioxide form Ruthenium Tetroxide: A Simple Approach to High–Purity $RuO_2$ Films," *Chem. Mater.*, 5, 908(1993). (no month).

METHODS FOR PREPARING RUTHENIUM OXIDE FILMS

FIELD OF THE INVENTION

This invention relates to the preparation of ruthenium oxide films using chemical vapor deposition and liquid ruthenium precursors.

BACKGROUND OF THE INVENTION

Films of metals and metal oxides, particularly ruthenium films and oxides thereof, are becoming important for a variety of electronic and electrochemical applications. For example, high quality $RuO_2$ thin films deposited on silicon wafers have recently gained interest for use in ferroelectric memories. Ruthenium films are generally unreactive to silicon and metal oxides, resistant to diffusion of oxygen and silicon, and are good conductors. Oxides of ruthenium also possess these properties, although perhaps to a different extent.

Thus, films of ruthenium and oxides thereof have suitable properties for a variety of uses in integrated circuits. For example, they can be used in integrated circuits for electrical contacts. They are particularly suitable for use as barrier layers between the dielectric material and the silicon substrate in memory devices, such as ferroelectric memories. Furthermore, they may even be suitable as the plate (i.e., electrode) itself in capacitors.

There are a wide variety of ruthenium compounds that can be used as precursors for the preparation of such films. Many are particularly well suited for use in chemical vapor deposition techniques. See, for example, U.S. Pat. No. 5,372,849 (McCormick et al.), which discloses the use of ruthenium compounds containing carbonyl ligands and other ligands. However, such compounds typically form dimers, which are less volatile and not as easily used in chemical vapor deposition techniques. Thus, there is a continuing need for methods for the preparation of ruthenium oxide films using chemical vapor deposition techniques.

SUMMARY OF THE INVENTION

The present invention provides methods for the preparation of ruthenium oxide films. In one embodiment, the method includes the steps of: providing a liquid precursor composition comprising one or more compounds of the formula (Formula I):

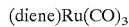

(diene)Ru(CO)$_3$ wherein: "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof; vaporizing the liquid precursor composition to form vaporized precursor composition; and directing the vaporized precursor composition in combination with an oxidizing gas toward the semiconductor substrate or substrate assembly to form a ruthenium oxide film on a surface of the semiconductor substrate or substrate assembly. This method is particularly useful on complex structures, such as those containing one or more small high aspect ratio openings, which typically require excellent step coverage.

Complexes of Formula I suitable for use in the methods of the present invention are neutral complexes and are liquids at a temperature within a range of about 20° C. to about 50° C. They can be used in flash vaporization, bubbling, microdroplet formation techniques, etc. As used herein, "liquid" refers to a neat liquid (a liquid at room temperature or a solid at room temperature that melts at an elevated temperature up to about 50° C.).

Methods of the present invention are particularly well suited for forming films on a surface of a semiconductor substrate or substrate assembly, such as a silicon wafer, having high surface area topology, such as high aspect ratio openings formed therein, but such gaps are not required, used in forming integrated circuits. It is to be understood that methods of the present invention are not limited to deposition on silicon wafers; rather, other types of wafers (e.g., gallium arsenide wafer, etc.) can be used as well. Also, the methods of the present invention can be used in silicon-on-insulator technology. Furthermore, substrates other than semiconductor substrates or substrate assemblies can be used in methods of the present invention. These include, for example, fibers, wires, etc. If the substrate is a semiconductor substrate or substrate assembly, the films can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

In one embodiment of the invention, a method of manufacturing a semiconductor structure, preferably having a surface with one or more small high aspect ratio openings therein is provided. The method includes the steps of: providing a semiconductor substrate or substrate assembly, which is preferably at a temperature of about 130° C. to about 300° C. (more preferably, at a temperature of about 140° C. to about 180° C.), and contained within a reaction chamber preferably having a pressure of about $10^{-3}$ torr to about 1 atmosphere (more preferably, having a pressure of about 0.1 torr to about 10 torr); providing a liquid precursor composition preferably at a temperature of about 20° C. to about 50° C. (more preferably, at a temperature of about 40° C. to about 50° C.), the precursor composition comprising one or more compounds of Formula I; vaporizing the liquid precursor composition to form vaporized precursor composition; and directing the vaporized precursor composition in combination with an oxidizing gas toward the semiconductor substrate or substrate assembly to form a ruthenium oxide film on the surface of the semiconductor substrate or substrate assembly having the one or more small high aspect ratio openings.

DETAILED DESCRIPTION OF PREFERRED EMBODIMENTS

Figure 1:
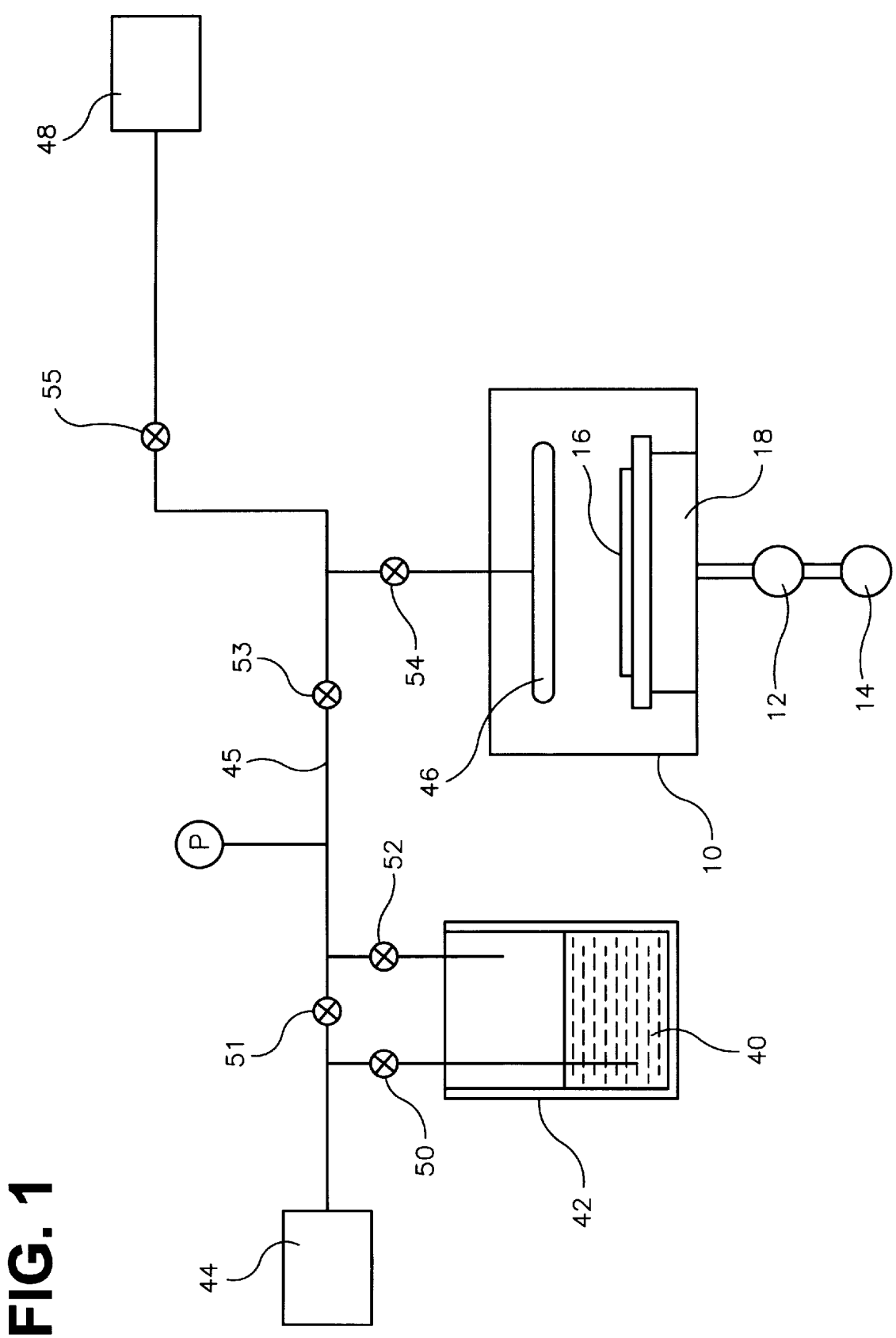
FIG. 1 is a schematic of a chemical vapor deposition system suitable for use in the method of the present invention.

The present invention provides methods of forming a ruthenium oxide film using a chemical vapor deposition technique and one or more liquid ruthenium complexes. Specifically, the present invention is directed to methods of manufacturing a semiconductor device having a ruthenium oxide film thereon.

The liquid ruthenium complexes are of the following formula (Formula I):

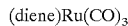
(diene)Ru(CO)$_3$ wherein: "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof. Preferably, the diene ligands include about 5 to about 8 carbon atoms, and more preferably, about 6 to about 7 carbon atoms. These precursor complexes are described in Applicants' Assignees' copending patent application entitled "Precursor Chemistries for Chemical Vapor Deposition of Ruthenium and Ruthenium Oxide" having U.S. Ser. No. 09/141,236, dated Aug. 27, 1998, and filed on even date herewith. They can be prepared according to methods described therein or according to methods described in Applicants' Assignees' copending patent application entitled "Methods for Preparing Ruthenium and Osmium Compounds" having U.S. Ser. No. 09/141,431, dated Aug. 27, 1998, filed on even date herewith.

Complexes of Formula I that are suitable for use in the present invention are neutral complexes and are liquids at room temperature or a solids at room temperature that melt at an elevated temperature up to about 50° C. These complexes are suitable for use in chemical vapor deposition (CVD) techniques, such as flash vaporization techniques, bubbler techniques, and/or microdroplet techniques. Preferred embodiments of the complexes described herein are particularly suitable for low temperature CVD, e.g., deposition techniques involving substrate temperatures of about 100° C. to about 400° C.

A preferred class of complexes include those that have a vapor pressure of greater than 0.1 torr at 50° C. Examples of such compounds include (cyclohexadiene)Ru(CO)$_3$ and (cycloheptadiene)Ru(CO)$_3$.

The precursor composition can be vaporized in the presence of one or more reaction gases and optionally one or more inert carrier gases to form a ruthenium oxide film. The inert carrier gas is typically selected from the group consisting of nitrogen, helium, argon, and mixtures thereof. In the context of the present invention, an inert carrier gas is one that is generally unreactive with the complexes described herein and does not interfere with the formation of a ruthenium oxide film. The reaction gas can be selected from a wide variety of oxidizing gases reactive with the complexes described herein, at least at a surface under the conditions of chemical vapor deposition. Examples of oxidizing gases include $O_2$, $N_2O$, $O_3$, NO, $NO_2$, $H_2O_2$, and $H_2O$. Various combinations of reaction gases and optional carrier gases can be used in the methods of the present invention to form films.

Methods of the present invention are particularly well suited for forming highly pure ruthenium oxide films (preferably, at least about 95 atom-% pure, based on X-ray Photoelectron Spectroscopy (XPS), Auger Spectroscopy, or other methods) on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. Methods of the present invention are particularly useful for depositing highly pure ruthenium oxide films on the surface of a semiconductor substrate or substrate assembly, such as a silicon wafer, having a high surface area topology, such as a surface (e.g., of an insulation layer) having high aspect ratio openings (i.e., gaps) formed therein. Small high aspect ratio openings typically have feature sizes or critical dimensions below about 1 micron (e.g., the diameter or width of an opening is less than about 1 micron), and more typically, about 0.3 micron to about 1 micron, and aspect ratios greater than about 1. Such aspect ratios are applicable to contact holes, vias, trenches, and a variety of other configurations. For example, a trench having an opening of 1 micron and a depth of 3 microns has an aspect ratio of 3. The present invention is particularly beneficial for forming diffusion barrier layers in small high aspect ratio features due to the use of CVD processes for forming conformal ruthenium oxide diffusion barrier layers over step structures. Typically, using methods of the present invention greater than about 80% step coverage can be achieved. This refers to the ratio of the thickness of the layer deposited on the bottom surface to that on the top surface.

The ruthenium oxide film is deposited upon decomposition (typically, thermal decomposition) of one or more complexes of Formula I. Methods of the present invention can utilize various vapor deposition techniques, such as flash vaporization, bubbling, etc., optionally photo- or plasma-assisted (although photo- and plasma-assisted depositions do not typically provide good step coverage). Examples of suitable CVD processes are generally discussed in Applicants' Assignees' copending patent application entitled "Precursor Chemistries for Chemical Vapor Deposition of Ruthenium and Ruthenium Oxide," having Ser. No. 09/141,236 dated Aug. 27, 1998, and filed on even date herewith, as well as in U.S. Pat. No. 5,372,849 (McCormick et al.), for example.

A typical chemical vapor deposition (CVD) system that can be used to perform a process of the present invention is shown in FIG. 1. The system includes an enclosed chemical vapor deposition chamber 10, which may be a cold wall-type CVD reactor. Reduced pressure may be created in chamber 10 using turbo pump 12 and backing pump 14. Preferably, the chamber pressure during deposition is about $10^{-3}$ torr to about atmospheric pressure, and most preferably, it is about 0.1 torr to about 10 torr. The pressure is chosen such that it produces good step coverage and deposition rates.

One or more substrates 16 (e.g., semiconductor substrates or substrate assemblies) are positioned in chamber 10. A constant nominal temperature is established for the substrate, preferably at a temperature of about 130° C. to about 300° C. For optimum step coverage, deposition rate, and formation of a film, the most preferred substrate temperature is about 140° C. to about 180° C. Substrate 16 may be heated, for example, by an electrical resistance heater 18 on which substrate 16 is mounted. Other known methods of heating the substrate may also be utilized.

For plasma- and photo-assisted CVD processes, however, the temperature of the substrate may be significantly lower.

In this process, the precursor composition 40, which contains one or more complexes of Formula I, is stored in liquid form (a neat liquid at room temperature or at an elevated temperature if solid at room temperature) in vessel 42. The temperature of the liquid precursor composition is preferably about 20° C. to about 50° C., and more preferably, about 40° C. to about 50° C. The pressure within vessel 42 is typically similar to that within chamber 10. A source 44 of a suitable inert gas is pumped into vessel 42 and bubbled through the neat liquid (i.e., without solvent) picking up the precursor composition and carrying it into chamber 10 through line 45 and gas distributor 46. Additional inert carrier gas or reaction gas may be supplied from source 48 as needed to provide the desired concentration of precursor composition and regulate the uniformity of the deposition across the surface of substrate 16. As shown, valves 50–55 are opened and closed as required. The reaction and optional carrier gases can be preheated if desired.

Generally, the precursor composition is carried into the CVD chamber 10 at a flow rate of the carrier gas of about 10 sccm (standard cubic centimeters) to about 500 sccm, and preferably, at a flow rate of about 100 sccm to about 400 sccm. A reaction gas (preferably, an oxidizing gas such as $O_2$) is typically introduced into the CVD chamber 10 at a flow rate of about 10 sccm to about 1000 sccm, and preferably, at a flow rate of about 50 sccm to about 500 sccm. The semiconductor substrate is exposed to the precursor composition at a pressure of about 0.1 torr to about 10 torr for a time of about 10 seconds to about 30 minutes depending on the desired thickness. In chamber 10, the precursor composition will form an adsorbed layer on the surface of the substrate 16. As the deposition rate is temperature dependent, increasing the temperature of the substrate will typically increase the rate of deposition. However, if step coverage is required, higher temperatures may become detrimental. Thus a substrate temperature is chosen to balance these two properties. Typically, desirable deposition rates are about 100 Angstroms/minute to about 1000 Angstroms/minute. The carrier gas containing the precursor composition is terminated by closing valve 53.

Alternatives to such methods include an approach wherein the precursor composition is heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society* 78, 2763–2768 (1995). The complexes of Formula I are also particularly well suited for use with vapor deposition systems, as described in copending application U.S. Ser. No. 08/720,710 entitled "Method and Apparatus for Vaporizing Liquid Precursor compositions and System for Using Same," filed on Oct. 2, 1996. Generally, one method described therein involves the vaporization of a precursor composition in liquid form. In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compositions (either in the form of a neat liquid or solid dissolved in a liquid medium) and provides reasonable deposition rates, particularly in device applications with small dimensions.

Various combinations of carrier gases and/or reaction gases can be used in certain methods of the present invention. They can be introduced into the chemical vapor deposition chamber in a variety of manners, such as directly into the vaporization chamber or in combination with the precursor composition.

Although specific vapor deposition processes are described by reference to FIG. 1, methods of the present invention are not limited to being used with the specific vapor deposition systems shown. Various CVD process chambers or reaction chambers can be used, including hot wall or cold wall reactors, atmospheric or reduced pressure reactors, as well as plasma enhanced reactors. Furthermore, methods of the present invention are not limited to any specific vapor deposition techniques.

After deposition, the film can be further annealed to crystallize and/or further oxidize it if desired. This can be done in the CVD reaction chamber or not. To crystallize and/or densify a film, preferably, the annealing process is carried out in an inert gas, as described above for the carrier gases. To further oxidize a film, preferably, the annealing process is carried out in an oxidizing gas, as described above for the reaction gases. Preferably, the pressure of this post annealing process is about 0.5 torr to about 5 atmospheres. Preferably, the substrate temperature of this post annealing process is about 100° C. to about 1000° C., and more preferably, about 300° C. to about 800° C.

The use of the complexes and methods of forming films of the present invention are beneficial for a wide variety of thin film applications in semiconductor structures, particularly those requiring diffusion barriers. For example, such applications include capacitors and metallization layers, such as multilevel interconnects in an integrated circuit structure. Such structures are described, for example, in Applicants' Assignees' copending patent application entitled "Ruthenium Silicide Diffusion Barrier Layers and Methods of Forming Same," having Ser. No. 09/141,240 dated Aug. 27, 1998, and filed on even date herewith.

The following examples are offered to further illustrate the various specific and preferred embodiments and techniques. It should be understood, however, that many variations and modifications may be made while remaining within the scope of the present invention.

EXAMPLES

Ruthenium Oxide Film Deposition Using $(C_6H_8)Ru(CO)_3$

The pale yellow precursor, $(C_6H_8)Ru(CO)_3$, was added to a bubbler equipped with a dip tube and exit valve. The bubbler was connected to a CVD reactor. The bubbler was further connected to helium carrier gas introduced through a mass flow controller into the dip tube port of the bubbler. The bubbler was heated to about 40° C. and all downstream connections to the chamber were heated to about 50° C. to about 60° C. A silicon wafer having a layer of BPSG thereon (into which was etched various sizes of contact holes) was placed on a heated chuck inside the CVD reactor. Ruthenium deposition was carried out by heating the wafer to 150° C. (as measured by a thermocouple placed on the surface of the wafer) and establishing a chamber pressure of 3 torr using a helium carrier flow of 25 sccm and an additional flow of oxygen (plumbed separately to the precursor delivery line) at 50 sccm. The helium carrier flow was diverted through the precursor bubbler for 4.0 minutes yielding a film that was later measured by SEM micrographs to be 8950 Angstroms thick. This corresponds to a deposition rate of 237 Angstroms/minute. The film was highly reflective and consisted of highly pure ruthenium oxide (as determined by XPS on blanket films). X-ray diffraction proved the films to be amorphous ruthenium oxide and SEM micrographs revealed better than 85% step coverage in holes nominally 0.3 micron to 1.0 micron in diameter and 2.5 microns deep.

All patents, patent applications, and publications are herein incorporated by reference in their entirety, as if each were individually incorporated. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A method of manufacturing a semiconductor structure, the method comprising:
   providing a semiconductor substrate or substrate assembly;
   providing a liquid precursor composition comprising one or more compounds of the formula:

$$(\text{diene})\text{Ru}(\text{CO})_3$$

wherein "diene" refers to linear, branched, or cyclic dienes, bicyclic dienes, tricyclic dienes, derivatives thereof comprising halide, Si, S, Se, P, As, N, or O heteroatoms, or combinations of said heteroatoms;
   vaporizing the liquid precursor composition to form vaporized precursor composition; and
   directing the vaporized precursor composition in combination with at least one oxidizing gas toward the semiconductor substrate or substrate assembly to form a ruthenium oxide film on a surface of the semiconductor substrate or substrate assembly.

2. The method of claim 1 wherein the temperature of the substrate or substrate assembly is about 130° C. to about 300° C.

3. The method of claim 1 wherein the temperature of the substrate or substrate assembly is about 140° C. to about 180° C.

4. The method of claim 3 wherein the substrate or substrate assembly is contained within a reaction chamber having a pressure of about $10^{-3}$ torr to about 1 atmosphere.

5. The method of claim 4 wherein the substrate or substrate assembly is contained within a reaction chamber having a pressure of about 0.1 torr to about 10 torr.

6. The method of claim 1 wherein the substrate or substrate assembly is contained within a reaction chamber having a pressure of about 0.1 torr to about 10 torr.

7. The method of claim 1 wherein the step of vaporizing the liquid precursor comprises using a technique selected from the group consisting of flash vaporization, bubbling, microdroplet formation, and combinations thereof.

8. The method of claim 1 wherein the semiconductor substrate or substrate assembly comprises a silicon wafer.

9. The method of claim 1 wherein the precursor composition is vaporized in the presence of at least one carrier gas.

10. The method of claim 1 wherein the oxidizing gas is selected from the group consisting of $O_2$, $N_2O$, $O_3$, NO, $NO_2$, $H_2O_2$, $H_2O$, and combinations thereof.

11. The method of claim 10 wherein the oxidizing gas is $O_2$.

12. The method of claim 1 wherein the diene derivative is a fluorinated diene.

13. A method of manufacturing a semiconductor structure, the method comprising:
   providing a semiconductor substrate or substrate assembly, which is at a temperature of about 130° C. to about 300° C., contained within a reaction chamber having a pressure of about $10^{-3}$ torr to about 1 atmosphere;
   providing a liquid precursor composition at a temperature of about 20° C. to about 50° C., the precursor composition comprising one or more compounds of the formula:

$$(\text{diene})\text{Ru}(\text{CO})_3$$

wherein "diene" refers to linear, branched, or cyclic dienes, bicyclic dienes, tricyclic dienes, derivatives thereof comprising halide, Si, S, Se, P, As, N, or O heteroatoms, or combinations of said heteroatoms;
   vaporizing the liquid precursor composition to form vaporized precursor composition; and
   directing the vaporized precursor composition in combination with at least one oxidizing gas toward the semiconductor substrate or substrate assembly to form a ruthenium oxide film on a surface of the semiconductor substrate or substrate assembly.

14. The method of claim 13 wherein the diene derivative is a fluorinated diene.

15. A method of manufacturing a semiconductor structure, the method comprising:
   providing a semiconductor substrate or substrate assembly;
   providing a liquid precursor composition comprising one or more compounds of the formula:

$$(\text{diene})\text{Ru}(\text{CO})_3$$

wherein "diene" refers to linear, branched, or cyclic dienes, bicyclic dienes, tricyclic dienes, derivatives thereof comprising halide, Si, S, Se, P, As, N, or O heteroatoms, or combinations of said heteroatoms;
   vaporizing the liquid precursor composition to form vaporized precursor composition; directing the vaporized precursor composition in combination with at least one oxidizing gas toward the semiconductor substrate or substrate assembly to form a ruthenium oxide film on a surface of the semiconductor substrate or substrate assembly; and
   annealing the ruthenium oxide film.

16. The method of claim 15 wherein the annealing step is carried out at a temperature of about 300° C. to about 1000° C.

17. The method of claim 15 wherein the diene derivative is a fluorinated diene.

18. A method of manufacturing a semiconductor structure, the method comprising:
   providing a semiconductor substrate or substrate assembly comprising a surface having one or more small high aspect ratio openings;
   providing a liquid precursor composition comprising one or more compounds of the formula:

$$(\text{diene})\text{Ru}(\text{CO})_3$$

wherein "diene" refers to linear, branched, or cyclic dienes, bicyclic dienes, tricyclic dienes, derivatives thereof comprising halide, Si, S, Se, P, As, N, or O heteroatoms, or combinations of said heteroatoms;
   vaporizing the liquid precursor composition to form vaporized precursor composition; and
   directing the vaporized precursor composition in combination with at least one oxidizing gas toward the semiconductor substrate or substrate assembly to form a ruthenium oxide film on the surface of the semiconductor substrate or substrate assembly having the one or more high aspect ratio openings.

19. The method of claim 18 wherein the diene derivative is a fluorinated diene.

20. A method of forming a ruthenium oxide film on a substrate, the method comprising:

providing a substrate;

providing a liquid precursor composition comprising one or more compounds of the formula:

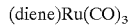

wherein "diene" refers to linear, branched, or cyclic dienes, bicyclic dienes, tricyclic dienes, derivatives thereof comprising halide, Si, S, Se, P, As, N, or O heteroatoms or combinations of said heteroatoms;

vaporizing the liquid precursor composition to form vaporized precursor composition; and directing the vaporized precursor composition in combination with at least one oxidizing gas toward the substrate to form a ruthenium oxide film on a surface of the substrate.

21. The method of claim 20 wherein the diene derivative is a fluorinated diene.

22. A method of manufacturing a semiconductor structure, the method comprising:

providing a semiconductor substrate or substrate assembly comprising a surface having one or more small high aspect ratio openings, which is at a temperature of about 130° C. to about 300° C., wherein the semiconductor substrate or substrate assembly is contained within a reaction chamber having a pressure of about $10^{-3}$ torr to about 1 atmosphere;

providing a liquid precursor composition at a temperature of about 20° C. to about 50° C., the precursor composition comprising one or more compounds of the formula:

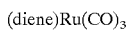

wherein "diene" refers to linear, branched, or cyclic dienes, bicyclic dienes, tricyclic dienes, derivatives thereof comprising halide, Si, S, Se, P, As, N, or O heteroatoms or combinations of said heteroatoms;

vaporizing the liquid precursor composition to form vaporized precursor composition; and directing the vaporized precursor composition in combination with at least one oxidizing gas toward the semiconductor substrate or substrate assembly to form a ruthenium oxide film on the surface of the semiconductor substrate or substrate assembly having the one or more small high aspect ratio openings.

23. The method of claim 22 wherein the diene derivative is a fluorinated diene.

* * * * *